United States Patent
Cagli et al.

(10) Patent No.: US 9,847,446 B2
(45) Date of Patent: Dec. 19, 2017

(54) ELECTROLUMINESCENT DEVICE WITH INTEGRATED SENSOR AND METHOD FOR CONTROLLING THE EMISSION OF THE DEVICE

(71) Applicant: ALEDIA, Grenoble (FR)

(72) Inventors: Carlo Cagli, Grenoble (FR); Giorgio Anania, Medan (FR)

(73) Assignee: ALEDIA, Grenoble (FR)

(*) Notice: Subject to any disclaimer, the term of this patent is extended or adjusted under 35 U.S.C. 154(b) by 0 days.

(21) Appl. No.: 14/778,017

(22) PCT Filed: Mar. 25, 2014

(86) PCT No.: PCT/EP2014/055907
§ 371 (c)(1),
(2) Date: Sep. 17, 2015

(87) PCT Pub. No.: WO2014/154657
PCT Pub. Date: Oct. 2, 2014

(65) Prior Publication Data
US 2016/0284933 A1  Sep. 29, 2016

(30) Foreign Application Priority Data

Mar. 28, 2013 (FR) ...................... 13 52811

(51) Int. Cl.
*H01L 33/00* (2010.01)
*H01L 33/06* (2010.01)
(Continued)

(52) U.S. Cl.
CPC .............. *H01L 33/06* (2013.01); *H01L 27/15* (2013.01); *H01L 27/156* (2013.01);
(Continued)

(58) Field of Classification Search
CPC G01J 3/12; G01J 5/06; H01L 21/0245; H01L 21/02513; H01L 27/15;
(Continued)

(56) References Cited

U.S. PATENT DOCUMENTS 7,193,246 B1 * 3/2007 Tanizawa ............... B82Y 20/00
257/101
8,759,777 B2 * 6/2014 Tsang .................... G01J 1/0462
250/340
(Continued)

FOREIGN PATENT DOCUMENTS

WO   2012/156620 A2   11/2012

*Primary Examiner* — Tung X Le
(74) *Attorney, Agent, or Firm* — Baker & Hostetler LLP

(57) ABSTRACT

An electroluminescent device comprises a structure comprising a set of nanowires on the surface of a substrate, comprising: a first series of primary so-called emission nanowires ($NTi_e$) comprising nanowires connected to first electrical contacts and capable of emitting light under the action of a forward first voltage from a forward voltage or current source; a second series of secondary detection nanowires ($NTi_d$) adjacent to the primary nanowires, connected to second electrical contacts and capable of generating a photocurrent under the action of an ambient light and/or of a portion of the light emitted by some of the primary nanowires, under the control of a second reverse voltage, from a voltage or current source; means for controlling the forward voltage as a function of the photocurrent. A method for controlling the luminance of an electroluminescent device is provided.

15 Claims, 6 Drawing Sheets

(51) Int. Cl.

| | |
|---|---|
| H01L 27/15 | (2006.01) |
| H01L 33/08 | (2010.01) |
| H01L 33/16 | (2010.01) |
| H01L 33/24 | (2010.01) |
| H01L 31/153 | (2006.01) |
| H01L 33/32 | (2010.01) |
| H05B 33/08 | (2006.01) |

(52) U.S. Cl.
CPC ............ *H01L 31/153* (2013.01); *H01L 33/08* (2013.01); *H01L 33/16* (2013.01); *H01L 33/24* (2013.01); *H01L 33/32* (2013.01); *H05B 33/0854* (2013.01); *H05B 33/0872* (2013.01)

(58) Field of Classification Search
CPC ... H01L 31/153; H01L 31/1884; H01L 33/06; H01L 33/08; H01L 33/24; H01L 33/32; H01L 33/0854
See application file for complete search history.

(56) References Cited

U.S. PATENT DOCUMENTS

| | | | |
|---|---|---|---|
| 2010/0033561 A1* | 2/2010 | Hersee | G02B 21/002 348/80 |
| 2010/0127280 A1* | 5/2010 | Katoh | H01L 27/1446 257/82 |
| 2012/0223289 A1 | 9/2012 | Gwo et al. | |
| 2015/0303332 A1* | 10/2015 | Chang | B82Y 30/00 136/256 |

* cited by examiner

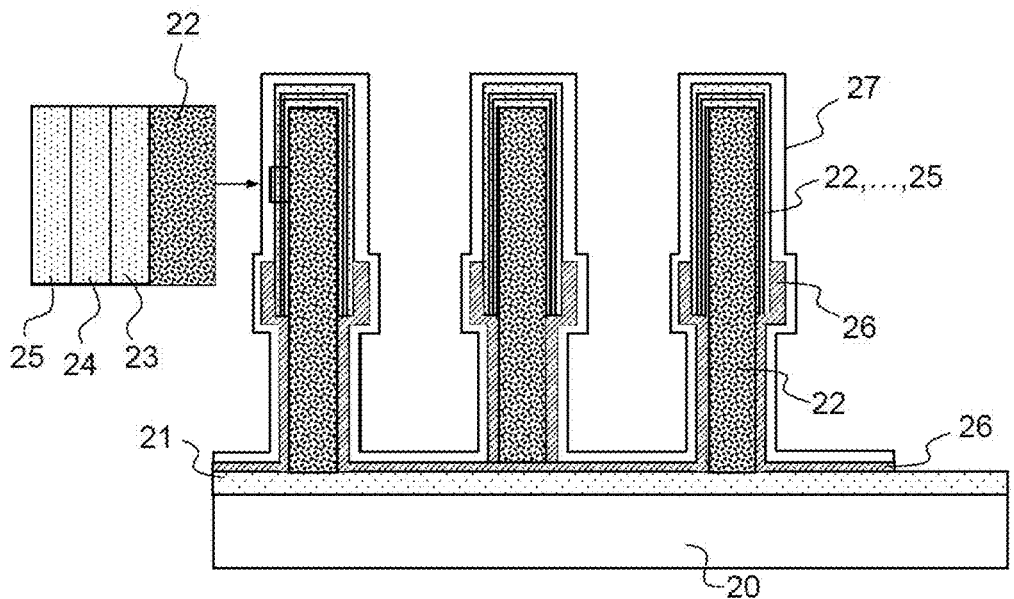
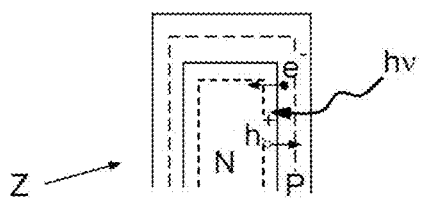
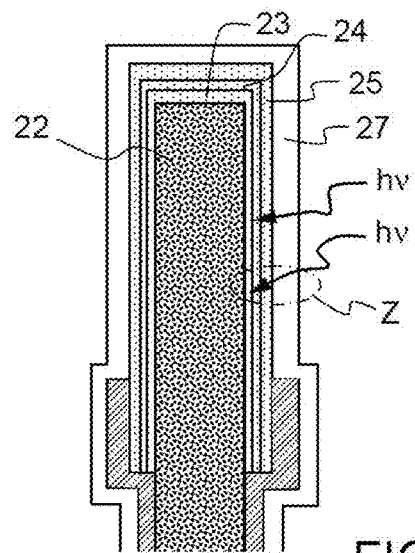
FIG. 1
PRIOR ART
FIG. 2

ELECTROLUMINESCENT DEVICE WITH INTEGRATED SENSOR AND METHOD FOR CONTROLLING THE EMISSION OF THE DEVICE

CROSS-REFERENCE TO RELATED APPLICATIONS

This application is a National Stage of International patent application PCT/EP2014/055907, filed on Mar. 25, 2014, which claims priority to foreign French patent application No. FR 1352811, filed on Mar. 28, 2013, the disclosures of which are incorporated by reference in their entirety.

FIELD OF THE INVENTION

The field of the invention is that of light-emitting diodes, commonly referred to by their acronym LED.

An ongoing issue is how to ensure constant performance levels in terms of luminance of this type of device in order to make them reliable, and to do so notably over time.

The present invention thus aims to reduce the variability in terms of luminance performance in the case of LEDs with discrete elements, that can advantageously be of nanocolumn type, such as nanowires whose lateral dimensions (diameters) can for example be of the order of a few hundreds of nanometers and whose vertical dimension can range up to 10 or so micrometers, with a height/diameter ratio ranging from 1 to 30, and typically around 10.

BACKGROUND

In recent years, visible light-emitting diodes have for example been produced based on vertical InGaN/GaN nanowires containing a p-n junction and connected collectively in parallel.

By virtue of their potential intrinsic properties (good crystalline quality, relaxation of the constraints on the vertical free surfaces, good light extraction efficiency, etc), the nanowires are considered as very interesting candidates for mitigating the difficulties currently encountered with conventional GaN LEDs manufactured in planar (2D) structure).

Two nanowire LED approaches, based on different growth techniques, are known to those skilled in the art.

The first approach consists in epitaxiating GaN nanowires containing InGaN quantum wells in axial configuration by molecular beam epitaxy (MBE). The devices fabricated from these nanowires have given interesting results in the green spectral range. The processed chips of 1 $mm^2$ can emit around 10 µW at 550 nm for a direct operating current of 100 mA.

With the molecular beam (MBE) growth technique, some inhomogeneities appear because of random nucleation mechanisms, but typically an optical power of 50 nW has been obtained on a single wire emitting at 550 nm, i.e. 5 $mW/mm^2$ with a hundred thousand or so emitting nanowires/$mm^2$.

More recently, the MOCVD (metal organic chemical vapor deposition) growth technique has made it possible to produce InGaN/GaN nanowires containing a radial LED structure (core/shell configuration).

FIG. 1 illustrates this type of configuration in which nanowires $NT_n$ are produced on the surface of a substrate 20 covered by a nucleation layer 21 making it possible to produce the mesh adaptation between, for example, a substrate in silicon and nanowires in GaN.

The structure of the nanowires exhibiting a photoconductive part, comprising a core 22 in n-doped GaN typically with a doping rate of $10^{19}$ $cm^{-3}$, a quantum well structure with an alternation of layers 23, 24, that can respectively be in non-doped GaN and InGaN, and finally a p-doped GaN layer 25 with typically a doping rate of $10^{19} cm^{-3}$. An insulating dielectric layer 26 is provided in order to insulate the core 22 and the upper contact. The upper contacts are ensured via a conductive upper layer 27 transparent to the emission wavelength of the photoconductive structure.

In this approach, the LED structure being in core/shell configuration, the surface of the active zone is greater than in the 2D nanowire LED approach.

This property provides two advantages: the increase of the emissive surface and the reduction of the current densities in the active zone. Complete structures of MOCVD nanowire LEDs have been produced on silicon substrate and the electroluminescence in the blue spectral domain (450 nm) has been obtained on a set of integrated nanowires after technological process.

By virtue of the nanowire growth technologies, the surface zone of a chip can have hundreds of thousands of columns on a surface zone that can typically be 1 $mm^2$.

Such original structures, which exploit nanotechnologies, offer the advantage of increasing the emission surface zone and therefore the light flux.

SUMMARY OF THE INVENTION

In this context of LEDs with discrete elements of very small size, typically of the order of a few hundred nanometers up to 10 or so micrometers, the present invention proposes an electroluminescent device comprising an integrated sensor of photodiode type making it possible notably to regulate the luminance of the device and in which means are provided for shrewdly controlling the control voltage of the active electroluminescent elements from the integrated sensor.

More specifically, the subject of the present invention is an electroluminescent device comprising a structure comprising a set of nanowires on the surface of a substrate, characterized in that it comprises:

a first series of so-called emission primary nanowires comprising nanowires connected to first electrical contacts and capable of emitting light under the action of a so-called forward first voltage from a so-called forward voltage or current source;

a second series of secondary so-called detection nanowires adjacent to said primary nanowires, connected to second electrical contacts and capable of generating a photocurrent under the action of an ambient light and/or of a portion of the light emitted by some of said primary nanowires, under the control of a second so-called reverse voltage from a voltage or current source;

means for controlling said so-called forward voltage as a function of said photocurrent.

Preferably, the second so-called reverse voltage is from a voltage source.

In the case of a current source which powers the primary nanowires, the latter generates a fixed current, which is translated into an a priori variable voltage, that can typically be around 3 V. The power source of the secondary nanowires however generally remains at a given voltage (typically 0 V or less) to measure the current generated by the secondary nanowires.

According to a variant of the invention, the device comprises means for injecting said photocurrent into the forward voltage or current source so as to regulate said voltage, said means comprising a circuit external to said structure and comprising a current comparator comparing the photocurrent $I_{ph}$ generated by the secondary nanowires to a given reference current $I_{ref}$ and acting on said forward voltage or current source to control the voltage of the primary nanowires.

According to a variant of the invention, said second series of secondary so-called detection nanowires comprises at least one subset of detection nanowires capable of generating a photocurrent $I_{ph}$ under the control of a zero or reverse voltage, in the presence of ambient light, said device comprising a circuit external to said structure and comprising a current comparator comparing the photocurrent generated by the secondary nanowires to a threshold current $I_{ph \cdot s}$, so as to activate, via a power supply equipped with a switch, said electroluminescent device if said photocurrent value $I_{ph}$ is less than said threshold current value $I_{ph \cdot s}$.

According to a variant of the invention, said nanowires are covered by a transparent conductive layer, discontinuous between said primary nanowires and said secondary nanowires, so as to electrically disassociate one of said first electrical contacts from one of said second electrical contacts.

According to a variant of the invention, the substrate comprises, on a rear face defined as being opposite the face comprising said nanowires, a contact layer common to one of said first electrical contacts and to one of said second electrical contacts.

According to a variant of the invention, the device comprises subsets of secondary nanowires distributed over said substrate.

According to a variant of the invention, the device comprises a plurality of subsets of primary nanowires likely to emit photons at different wavelengths $\lambda i_c$, said device emitting a composite light resulting from the sum of the emissions at the different wavelengths $\lambda i_c$.

According to a variant of the invention, the device comprises a plurality of subsets of secondary nanowires, each subset of secondary nanowires being adjacent to a subset of primary nanowires emitting photons at a wavelength $\lambda i_c$, so as to be able to pick up said photons at said wavelength $\lambda i_c$.

According to a variant of the invention, said nanowires have structures based on heterojunction of III-V materials.

Another subject of the invention is a method for controlling an electroluminescent device according to the invention, characterized in that it comprises:

a step of detection of at least one photocurrent from at least one subset of secondary nanowires under the action of an ambient light and/or of a portion of a light emitted by some of said primary nanowires, under the control of a second so-called reverse voltage from a voltage or current source;

a step of controlling at least one subset of primary nanowires under the action of a so-called forward voltage as a function of said photocurrent.

Yet another subject of the invention is a method for controlling an electroluminescent device according to the invention, characterized in that it comprises a step of controlling, prior to said detection step, at least one subset of primary so-called emission nanowires, the emission of which is partly picked up by said secondary nanowires.

Another subject of the invention is a method for controlling the luminance of an electroluminescent device according to the invention, characterized in that it comprises the following steps:

the application of a first initial voltage to at least one subset of primary nanowires;

the application of a reverse voltage to at least one subset of the secondary nanowires so as to detect a photocurrent;

the integration of said photocurrent in the determination of a control voltage to be applied to said primary nanowires so as to regulate the luminance of said device.

Yet another subject of the invention is a method for controlling the distribution of the surface luminance of an electroluminescent device, according to the invention, characterized in that it comprises:

the application of a first initial voltage to a plurality of subsets of primary nanowires;

the application of a reverse voltage to a plurality of subsets of secondary nanowires, each subset of secondary nanowires being adjacent to a subset of primary nanowires emitting photons at a wavelength, said secondary nanowires being distributed over all of said substrate so as to detect a photocurrent per subset of secondary nanowires;

the integration of said photocurrents in the determination of a control voltage to be applied to said subsets of primary nanowires respectively associated with said subsets of secondary nanowires so as to regulate the surface distribution of the luminance of said device.

Also a subject of the invention is a method for controlling the color of an electroluminescent device according to the invention emitting a composite light resulting from the emission of a plurality of subsets of nanowires emitting at different wavelengths $\lambda i_c$, characterized in that it comprises:

the application of a first initial voltage to said subsets of primary nanowires;

the application of a reverse voltage to a plurality of subsets of secondary nanowires, each subset of secondary nanowires being adjacent to a subset of primary nanowires emitting photons at a wavelength $\lambda i_c$, so as to be able to pick up said photons at said wavelength $\lambda i_c$;

the integration of said photocurrents in the determination of a control voltage to be applied to said subsets of primary nanowires respectively associated with said subsets of secondary nanowires so as to regulate said composite color of said device.

Yet another subject of the invention is a method for controlling an electroluminescent device according to the invention, characterized in that it comprises the following steps:

the application of a reverse voltage to at least one subset of secondary nanowires so as to detect a photocurrent $I_{ph}$;

the comparison of said photocurrent to a current threshold value $I_{ph \cdot s}$;

the application of a forward voltage to the primary nanowires so as to activate said electroluminescent device, if said photocurrent value $I_{ph}$ is less than said threshold current value $I_{ph \cdot s}$.

BRIEF DESCRIPTION OF THE DRAWINGS

The invention will be better understood and other advantages will become apparent on reading the following description given by way of non-limiting example and by virtue of the attached figures in which:

FIG. 1 illustrates an LED configuration using nanowires with radial structure according to the known art;

FIG. 2 illustrates the phenomenon of capture by secondary nanowires of photons emitted by primary nanowires adjacent to said primary nanowires in a device of the invention;

DETAILED DESCRIPTION

Figure 3:
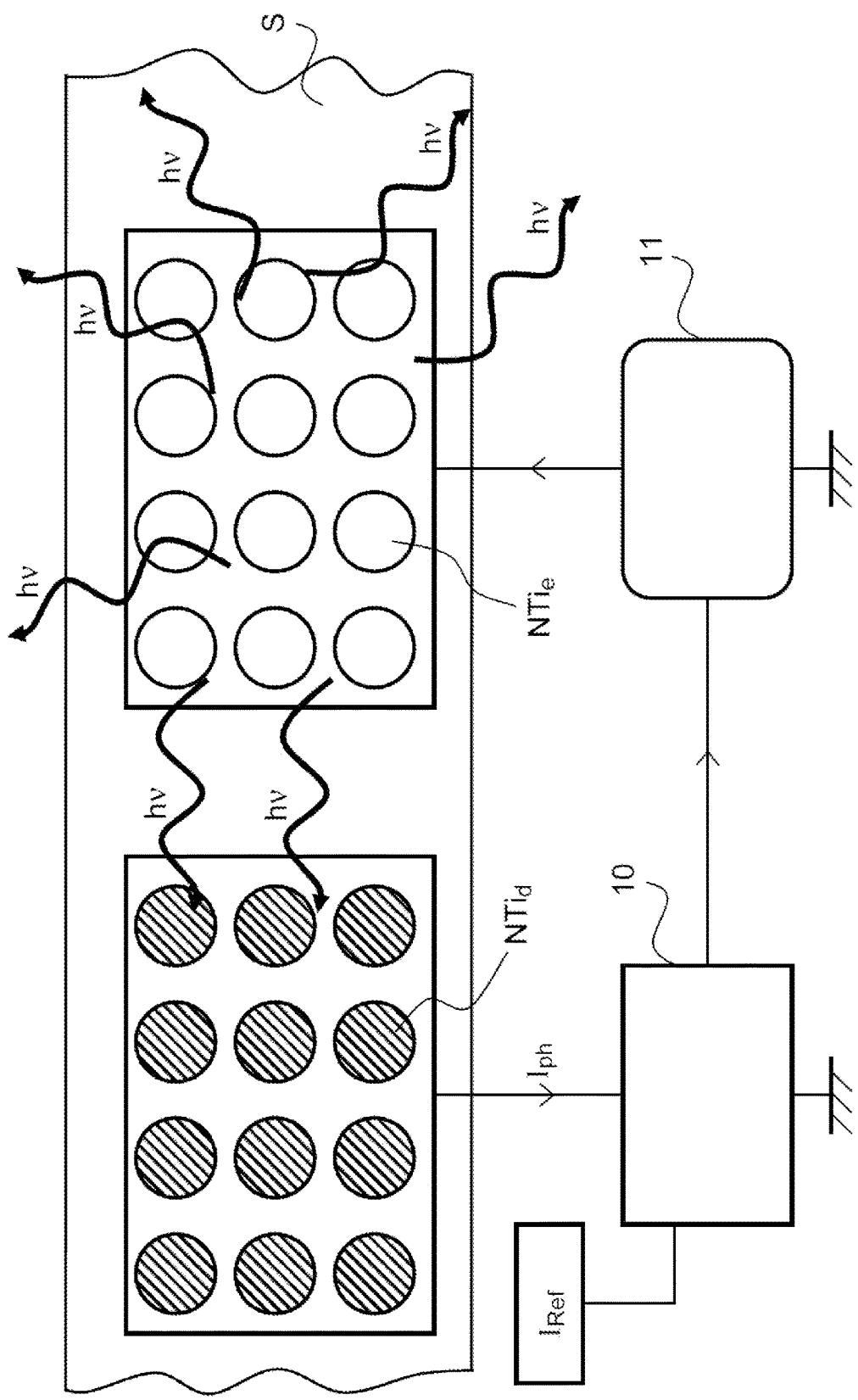
FIG. 3 illustrates a first variant device of the invention.

Generally, the electroluminescent device of the invention comprises a first series of primary nanowires intended to emit a light radiation under electrical control, typically under the action of a bias voltage, hereinafter called forward power supply voltage and a second series of secondary so-called detection nanowires intended to pick up photons emitted by the primary nanowires and to do so to generate a photocurrent.

The nanowires based on semiconductor material comprise junctions of PN type or preferentially of PIN type, i.e. P-doped regions, and N-doped regions, separated or not by a so-called intrinsic non-doped semiconductor region I. The difference in concentration between the carriers of the P and N regions provokes the circulation of a diffusion current tending to equalize the carrier concentration from one region to the other. The holes of the P region will diffuse to the N region leaving behind them ionized atoms, which constitute as many fixed negative charges. The same applies for the electrons of the N region which diffuse to the P region leaving behind them positive charges. There also appears, at the junction, a zone containing positive and negative fixed charges. These charges create an electrical field E and therefore an internal voltage $V_{int}$ which opposes the diffusion of the carriers such that an electrical balance is established.

If the junction is biased under a voltage $V_{direct}$, it reduces the barrier height which becomes $(V_{int}-V_{direct})$ Many electrons from the N region and holes from the P region can then cross this potential barrier and, then arriving in a "hostile medium" (P for electrons and N for the holes), they are recombined. To reestablish the balance, the holes of the P neutral region are set in motion to the zone where the recombination occurs (hole deficit). The electrons of the N neutral region are subject to a similar phenomenon. It is this phenomenon of local recombination which explains the circulation of the forward current in the junction.

Moreover, when a reverse-biased PN or PIN junction is exposed to light radiation, the latter can generate a large number of electron-hole pairs by passing an electron from the valency band to the conduction band. The photocarriers freed up in the depletion region and in the direct vicinity thereof are driven by the electrical field of the junction, which gives rise to a reverse current, proportional to the incident light intensity, called photo-induced current $I_{ph}$.

FIG. 2 illustrates the phenomenon of capture of photons in a secondary nanowire, in the case of nanowires of core/shell type structure, revealing the regions of N, I and P type the phenomena of electron-hole transport, respectively denoted $e^-$ and $h^+$. The region Z, photon capture zone, is enlarged.

The transfer of holes from the region N is schematically represented, this transfer being the source of the photocurrent created by absorption of the photons, the intrinsically non-doped region comprising a quantum well structure for example such as that represented in FIG. 1.

Thus, when the device of the invention is operating, the sensor part of said device measures the photocurrent linked to all of the photons received from the ambient light to which are added the photons generated by the primary nanowires electrically controlled to generate these photons.

According to the present invention, it is proposed to exploit this photocurrent detection notably to regulate the operation of said device by using a reaction loop, in which the photo-induced current is used to regulate the control voltage of the electroluminescent device so as to ensure a constant light power, whereas it can naturally be subject to variations of different origins. FIG. 3 illustrates such an operation with a structure S comprising the first series of primary nanowires $NTi_e$ intended to emit a light radiation under electrical control, typically under the action of a bias voltage or current, hereinafter denoted forward power supply voltage or current and the second series of so-called detection secondary nanowires $NTi_d$ intended to pick up some of the photons emitted by the primary nanowires, and to do so to generate a photocurrent. The generated photocurrent $I_{ph}$ is compared, via a current comparator 10, to a reference current $I_{ref}$, in order to introduce a given current or voltage into a power supply regulator 11 of the primary nanowires. Such a device notably makes it possible to ensure regulated luminance properties, the voltage control of the primary nanowires being able to be increased or reduced according to the emission power of the primary emission nanowires previously detected by at least some of the detection nanowires.

First Exemplary Electroluminescent Device

Figure 4A:
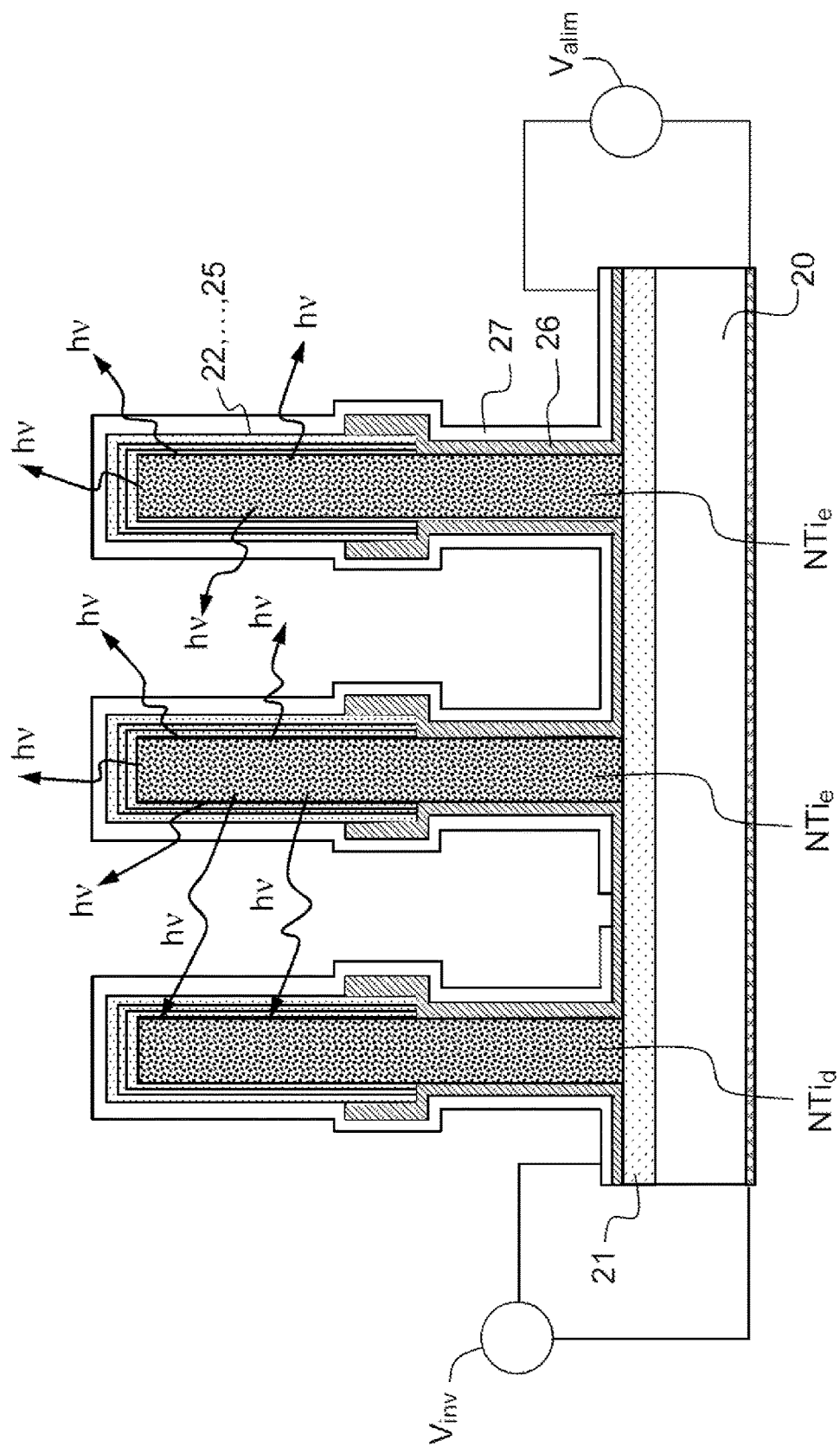
FIGS. 4a (cross-sectional view) and 4b (plan view) illustrate a first exemplary device according to the invention.
Figure 4B:
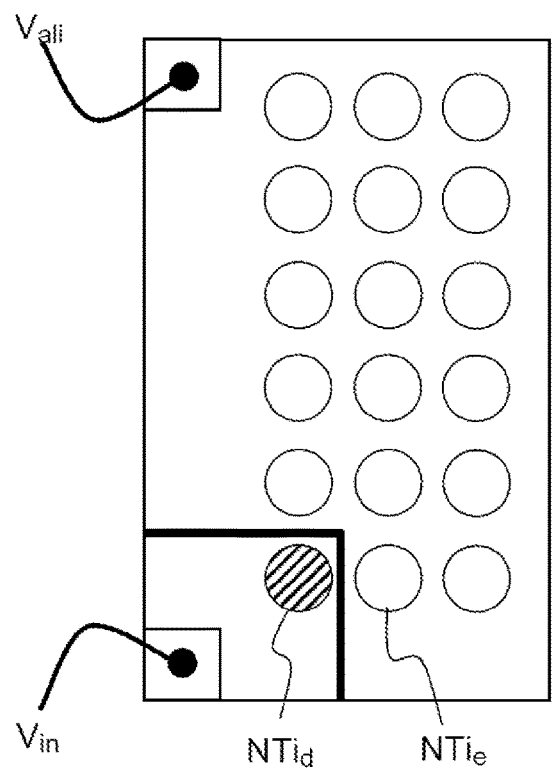

A first exemplary device is illustrated in FIGS. 4a and 4b. According to this example, the sensor part is positioned at the periphery of a substrate. The nanowires have structures of core/shell type based on GaN, of quantum wells or multiple wells in InGaN, likely to emit in the blue at 450 nm, such as those for example described previously and illustrated in FIG. 1.

The primary emission nanowires $NTi_e$ are electrically disassociated from the secondary detection nanowires $NTi_d$ by a discontinuous transparent conductive layer 27.

According to the principle used in the present invention, under the application of a negative voltage, a secondary nanowire is subjected to the radiation generated by its adjacent primary nanowires, subject to a positive control voltage, $V_{alim}$.

In the case of electroluminescent nanowires capable of absorbing in the blue at 450 nm, the Applicant considered that, from n=1.5, n being the refractive index of the medium between the nanowires, and by carrying out simulations, approximately 30% of the photons emitted by an adjacent primary nanowire were able to pass through said secondary nanowire considered.

By considering a total power emitted per chip of the order of 1 $W_{opt}$ (at 450 nm), it is possible to estimate a flow of photons emitted per nanowire of $6 \cdot 10^{12}$ ph/nanowire.sec.

The coefficient of absorption of a quantum well such as those used in this exemplary structure (2 nm of InGaN) is moreover of the order of $\alpha=10^5$ cm$^{-1}$, a nanowire having a width of approximately 2 nm, the absorption ratio can typically be of the order of 1%, by considering the absorption via the region P negligible.

In the case of a distribution of nanowires on a substrate according to a distribution of hexagonal type, a central nanowire is surrounded by 6 adjacent nanowires, and there is then obtained a total capture power due to the emission of the adjacent primary nanowires of:

$6 \cdot 6 \cdot 10^{12} \cdot 30\% \cdot 1\%$, i.e. $10^{11}$ ph/sec.

By considering a complete collection of the electrons thus generated, the current likely to be detected is equal to $10^{11} \cdot 1 \cdot 6 \ 10^{-19}$ C or approximately 10 nA, or a perfectly detectable current.

The above reasoning relates to the current generated by a single secondary nanowire, a fortiori by considering a hundred or so secondary nanowires, the value of the photocurrent likely to be thus detected, which is then approximately 1 µA, is accordingly amplified.

Figure 5:
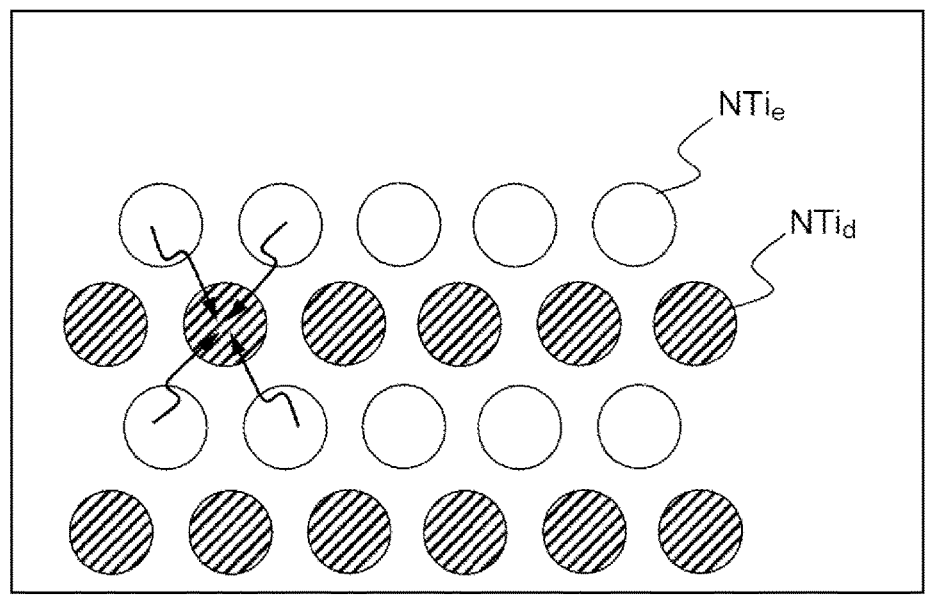
FIG. 5 illustrates a first exemplary distribution of primary nanowires and of secondary nanowires making it possible to amplify the photocurrent of the sensor part.

Linear distributions of primary nanowires and of secondary nanowires can for example be envisaged, enabling a secondary nanowire to be adjacent to 4 primary nanowires as illustrated in FIG. 5 for entire lines of primary nanowires. In this configuration each secondary nanowire $NTi_d$ is likely to receive photons emitted by the 4 adjacent primary nanowires $NTi_e$.

According to the present invention, it is also advantageous to provide a mode in which the sensor of photodiode type itself triggers the operation of the electroluminescent device from an ambient brightness level. In this case, the process is as follows:

a reverse voltage is applied to the secondary nanowires so as to detect a photocurrent;

if the latter is less than a threshold value $I_{ph\cdot s}$, a forward voltage is applied to the primary nanowires so as to activate said electroluminescent device.

Figure 6:
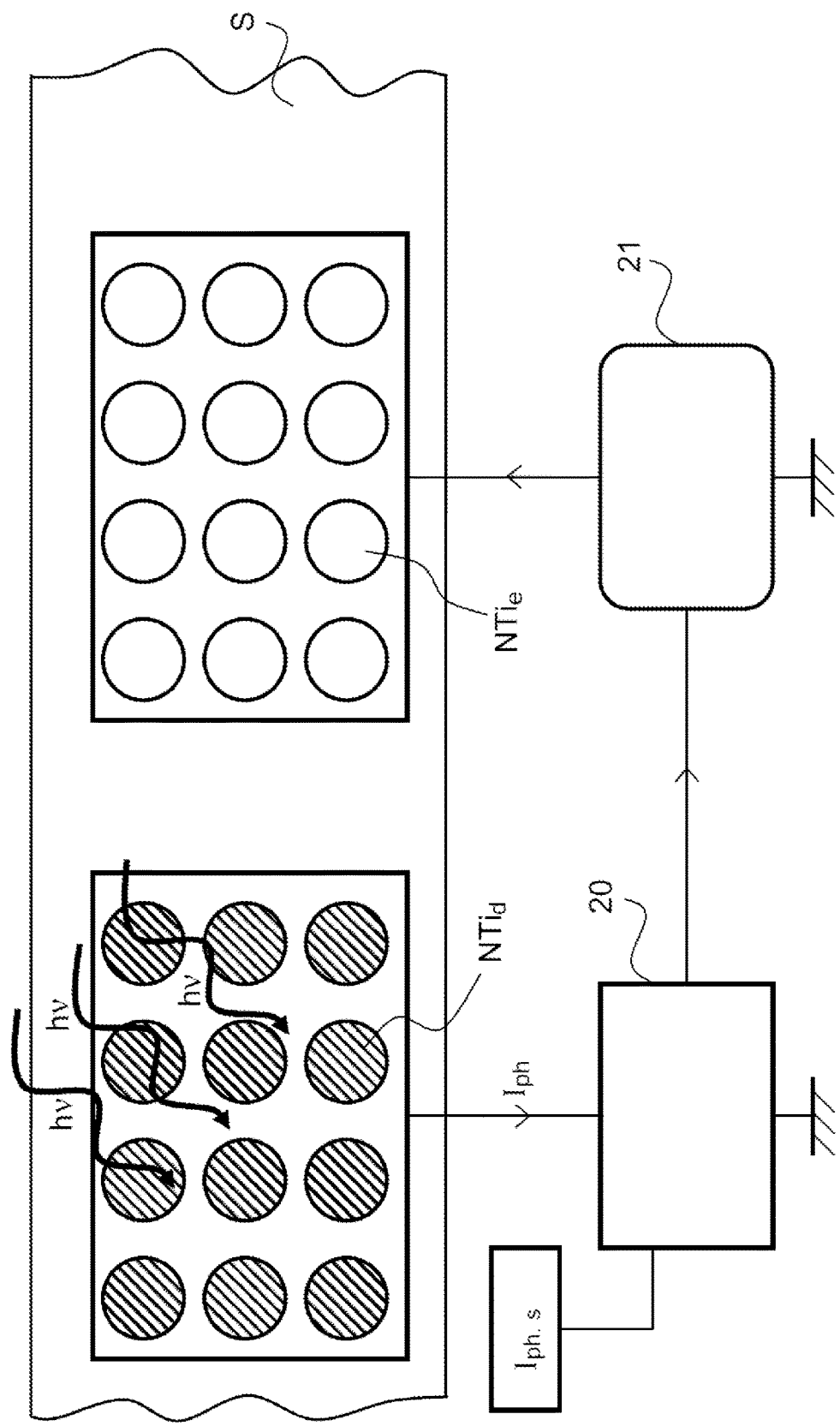
FIG. 6 illustrates a second variant device of the invention.

FIG. 6 illustrates such a device in which the structure S comprises detection nanowires $NTi_d$ which detect photons originating from the ambient light and which generate a photocurrent $I_{ph}$ which can advantageously be compared via a current comparator 20 to a threshold current $I_{ph\cdot s}$. If the detected photocurrent is less than said value $I_{ph\cdot s}$, this triggers the powering of the emission part consisting of the emitting primary nanowires $NTi_e$ via the power supply block 21 equipped with a switch.

Second Exemplary Electroluminescent Device According to the Invention

Figure 7:
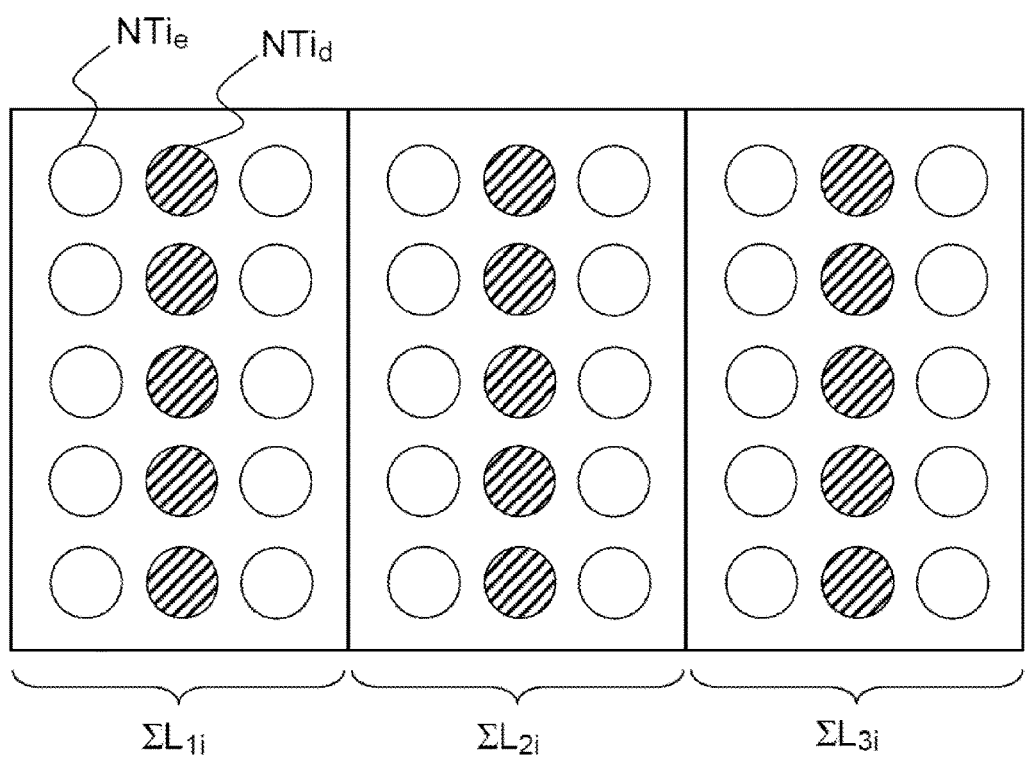
FIG. 7 illustrates a second exemplary distribution of secondary nanowires in all the nanowires of a device of the invention making it possible to produce a luminance mapping thereof.

According to a second exemplary device of the invention, the secondary nanowires are grouped together in subsets in different regions of the device making it possible to monitor the surface distribution in luminance L(x,y) of said device. FIG. 7 illustrates such a configuration with subsets of primary nanowires adjacent to subsets of secondary nanowires distributed over all of the substrate. A number of regions 1, 2 and 3 have been schematically represented showing the different summations of luminance relative to given regions. Together, these regions give luminance sums: $\Sigma L_{1i}(xi, yi)+\Sigma L_{2i}(xi, yi)+\Sigma L_{3i}(xi, yi)$ in the example schematically represented, that can be regulated by the respective photocurrents detected. In this example, the nanowires of the regions 1, 2 and 3 can be powered independently. The photocurrents generated by the subsets of secondary nanowires in the different sectors determine the correct power supply voltage of the respective primary nanowires so that $\Sigma L_{1i}=\Sigma L_{2i}=\Sigma L_{3i}$.

Third Exemplary Electroluminescent Device of LED type Emitting a White Light According to the Invention According to a third exemplary device of the invention, it is possible to monitor the quality of the emission of a composite light such as a white light that can be obtained from RGB (red, green, blue) components.

In effect, there are currently a number of technologies making it possible to obtain LEDs emitting a white light. A direct implementation method consists in combining three LEDs respectively emitting in the red, the green and the blue. Nevertheless, the driving of the different sources can prove difficult, in as much as the red, green and blue radiations have to be mixed in very precise proportions, and reproducibly throughout the life of the LED or irrespective of the environmental conditions.

The sensor or sensors of photodiode type integrated in the LED emitting white light make it possible to achieve these objectives.

It is thus possible to have a configuration similar to that illustrated in FIG. 7 with subsets of primary nanowires emitting in different wavelengths, respectively in the red: $\lambda i_R$, the green: $\lambda i_V$ and the blue: $\lambda i_B$. The secondary nanowires independently measure the three RGB components, and the power supply voltage of the primary nanowires in the respective sectors is monitored to determine a white radiation that is precise and constant in the time.

The invention claimed is:

1. An electroluminescent device comprising a structure comprising a set of nanowires on a surface of a substrate, further comprising:
    a first series of primary emission nanowires ($NTi_e$) comprising nanowires connected to first electrical contacts and capable of emitting light under the action of a forward first voltage from a forward voltage or current source; and
    a second series of secondary detection nanowires ($NTi_d$) adjacent to said primary nanowires, connected to second electrical contacts and capable of generating a photocurrent under the action of at least one of an ambient light and a portion of the light emitted by some of said primary nanowires, under the control of a second reverse voltage;
    wherein the photocurrent is used to regulate a control voltage of the electroluminescent device.

2. The electroluminescent device as claimed in claim 1, comprising means for injecting said photocurrent into the forward voltage or current source so as to regulate said forward voltage, said means for injecting comprising a circuit external to said structure and comprising a current comparator comparing the photocurrent generated ($I_{ph}$) by the secondary nanowires to a given reference current ($I_{ref}$) and acting on a power supply regulator of said forward voltage or current source to control the voltage of the primary nanowires.

3. The electroluminescent device as claimed in claim 1, wherein:
    said second series of secondary detection nanowires ($NTi_d$) comprises at least one subset of detection nanowires capable of generating a photocurrent ($I_{ph}$) under the control of a zero or reverse voltage, in the presence of ambient light; and
    said device comprising a circuit external to said structure and comprising a current comparator comparing the photocurrent generated by the secondary nanowires to a threshold current ($I_{ph\cdot s}$), so as to activate, via a power supply equipped with a switch, said electroluminescent device if said photocurrent value ($I_{ph}$) is less than said threshold current value ($I_{ph\cdot s}$).

4. The electroluminescent device as claimed in claim 1, wherein said nanowires are covered by a transparent conductive layer, discontinuous between said primary nanowires and said secondary nanowires, so as to electrically disassociate one of said first electrical contacts from one of said second electrical contacts.

5. The electroluminescent device as claimed in claim 1, wherein the substrate comprises, on a rear face defined as being opposite the face comprising said nanowires, a contact layer common to one of said first electrical contacts and to one of said second electrical contacts.

6. The electroluminescent device as claimed in claim 1, comprising subsets of secondary nanowires distributed over said substrate.

7. The electroluminescent device as claimed in claim 1, comprising a plurality of subsets of primary nanowires likely to emit photons at different wavelengths $\lambda i_c$, said device emitting a composite light resulting from the sum of the emissions at the different wavelengths $\lambda i_c$.

8. The electroluminescent device as claimed in claim 7, comprising a plurality of subsets of secondary nanowires, each subset of secondary nanowires being adjacent to a subset of primary nanowires emitting photons at a wavelength $\lambda i_c$, so as to be able to pick up said photons at said wavelength $\lambda i_c$.

9. The electroluminescent device as claimed in claim 1, wherein said nanowires have structures based on heterojunction of III-V materials.

10. A method for controlling an electroluminescent device comprising a structure comprising a set of nanowires on a surface of a substrate, further comprising: a first series of primary emission nanowires ($NTi_e$) comprising nanowires connected to first electrical contacts and capable of emitting light under the action of a forward first voltage from a forward voltage or current source; and a second series of secondary detection nanowires ($NTi_d$) adjacent to said primary nanowires, connected to second electrical contacts and capable of generating a photocurrent under the action of at least one of an ambient light and a portion of the light emitted by some of said primary nanowires, under the control of a second reverse voltage; wherein the photocurrent is used to regulate a control voltage of the electroluminescent device, the method comprising:
 a step of detection of at least one photocurrent from at least one subset of secondary nanowires under the action of an ambient light and of a portion of a light emitted by some of said primary nanowires, under the control of a second reverse voltage; and
 a step of controlling at least one subset of primary nanowires under the action of a forward voltage as a function of said photocurrent.

11. The method for controlling the electroluminescent device as claimed in claim 10, comprising a step of controlling, prior to said detection step, at least one subset of primary so-called emission nanowires ($NTi_e$), the emission of which is partly picked up by said secondary nanowires.

12. The method for controlling the electroluminescent device as claimed in claim 11, further comprising controlling the luminance of the electroluminescent device wherein controlling the luminance comprises the following steps:
 the application of a first initial voltage to at least one subset of primary nanowires;
 the application of a reverse voltage to at least one subset of the secondary nanowires so as to detect a photocurrent; and
 the integration of said photocurrent in the determination of a control voltage to be applied to said primary nanowires so as to regulate the luminance of said device.

13. The method for controlling the electroluminescent device as claimed in claim 11, further comprising controlling the distribution of the surface luminance of the electroluminescent device, wherein controlling the distribution comprises:
 the application of a first initial voltage to a plurality of subsets of primary nanowires;
 the application of a reverse voltage to a plurality of subsets of secondary nanowires, each subset of secondary nanowires being adjacent to a subset of primary nanowires emitting photons at a wavelength, said secondary nanowires being distributed over all of said substrate so as to detect a photocurrent per subset of secondary nanowires; and
 the integration of said photocurrents in the determination of a control voltage to be applied to said subsets of primary nanowires respectively associated with said subsets of secondary nanowires so as to regulate the surface distribution of the luminance of said device.

14. A method for controlling the color of an electroluminescent device comprising a structure comprising a set of nanowires on a surface of a substrate, further comprising: a first series of primary emission nanowires ($NTi_e$) comprising nanowires connected to first electrical contacts and capable of emitting light under the action of a forward first voltage from a forward voltage or current source; and a second series of secondary detection nanowires ($NTi_d$) adjacent to said primary nanowires, connected to second electrical contacts and capable of generating a photocurrent under the action of at least one of an ambient light and a portion of the light emitted by some of said primary nanowires, under the control of a second reverse voltage; wherein the photocurrent is used to regulate a control voltage of the electroluminescent device; and a plurality of subsets of primary nanowires likely to emit photons at different wavelengths $\lambda i_c$, said device emitting a composite light resulting from the emission of a plurality of subsets of nanowires emitting at different wavelengths $\lambda i_c$, the method comprising:
 the application of a first initial voltage to said subsets of primary nanowires;
 the application of a reverse voltage to a plurality of subsets of secondary nanowires, each subset of secondary nanowires being adjacent to a subset of primary nanowires emitting photons at a wavelength $\lambda i_c$, so as to be able to pick up said photons at said wavelength $\lambda i_c$; and
 the integration of said photocurrents in the determination of a control voltage to be applied to said subsets of primary nanowires respectively associated with said subsets of secondary nanowires so as to regulate said composite color of said device.

15. The method for controlling the electroluminescent device as claimed in claim 10, comprising the following steps:
 the application of a reverse voltage to at least one subset of secondary nanowires so as to detect a photocurrent ($I_{ph}$); and
 the comparison of said photocurrent to a current threshold value ($I_{ph\cdot s}$);
 the application of a forward voltage to the primary nanowires so as to activate said electroluminescent device, if said photocurrent value ($I_{ph}$) is less than said threshold current value ($I_{ph\cdot s}$).

* * * * *